United States Patent
Lai

(10) Patent No.: US 10,586,894 B2
(45) Date of Patent: Mar. 10, 2020

(54) LIGHT EMITTING UNIT AND DISPLAY DEVICE

(71) Applicant: PlayNitride Inc., Tainan (TW)

(72) Inventor: Yu-Hung Lai, Tainan (TW)

(73) Assignee: PlayNitride Inc., Tainan (TW)

( * ) Notice: Subject to any disclaimer, the term of this patent is extended or adjusted under 35 U.S.C. 154(b) by 12 days.

(21) Appl. No.: 15/488,975

(22) Filed: Apr. 17, 2017

(65) Prior Publication Data
US 2018/0226450 A1    Aug. 9, 2018

(30) Foreign Application Priority Data

Feb. 8, 2017    (TW) .............................. 106104076 A

(51) Int. Cl.
| | | |
|---|---|---|
| *H01L 33/38* | (2010.01) | |
| *H01L 33/20* | (2010.01) | |
| *H01L 25/16* | (2006.01) | |
| *H01L 33/62* | (2010.01) | |
| *H01L 25/075* | (2006.01) | |

(52) U.S. Cl.
CPC ............ *H01L 33/382* (2013.01); *H01L 33/20* (2013.01); *H01L 25/0753* (2013.01); *H01L 25/167* (2013.01); *H01L 33/62* (2013.01)

(58) Field of Classification Search
None
See application file for complete search history.

(56) References Cited

U.S. PATENT DOCUMENTS 8,987,761 B2 *   3/2015   Huang ................... H01L 33/20
                                                        257/88
9,786,812 B2 *  10/2017   Takenaga ............... H01L 33/20
(Continued)

FOREIGN PATENT DOCUMENTS

| CN | 101572289 | 11/2009 |
| CN | 103325907 | 9/2013 |

(Continued)

OTHER PUBLICATIONS

Taiwan Patent Office, "Office Action," issued in connection with Taiwan Patent Application No. 106104076, dated Jul. 11, 2017, 16 pages.

(Continued)

*Primary Examiner* — Nishath Yasmeen
(74) *Attorney, Agent, or Firm* — Hanley, Flight & Zimmerman, LLC

(57) ABSTRACT

A light emitting unit has a first electrode, a second electrode and an epitaxial structure disposed between the first electrode and the second electrode. The epitaxial structure has a light emission layer, a first type semiconductor layer disposed between the light emission layer and the first electrode, and a second type semiconductor layer disposed between the light emission layer and the second electrode. A first surface of the second type semiconductor layer is facing the light emission layer. The second type semiconductor layer has a second surface opposite to the first surface and the second surface has at least one recess. At least portion of the second electrode is disposed within the at least one recess. A display device has a substrate, a first electrode connection layer, a second electrode connection layer, and a plurality of aforementioned light emitting units.

26 Claims, 7 Drawing Sheets

(56) References Cited

U.S. PATENT DOCUMENTS

| | | | | |
|---|---|---|---|---|
| 2006/0270074 A1* | 11/2006 | Kim | ................... | B82Y 20/00 |
| | | | | 438/22 |
| 2010/0230685 A1* | 9/2010 | Cho | ................... | H01L 33/20 |
| | | | | 257/76 |
| 2011/0220932 A1 | 9/2011 | Katsuno et al. | | |
| 2013/0214322 A1* | 8/2013 | Eissler | ............... | H01L 33/0079 |
| | | | | 257/99 |
| 2015/0115293 A1* | 4/2015 | Wu | ................... | H01L 27/156 |
| | | | | 257/88 |

FOREIGN PATENT DOCUMENTS

| | | |
|---|---|---|
| DE | 102007057672 | 6/2009 |
| TW | 200947773 A | 11/2009 |
| TW | 201640667 A | 11/2016 |

OTHER PUBLICATIONS

The State Intellectual Property Office of China, "Office Action," issued in connection with Chinese Patent Application No. 201710068309.8, dated Mar. 21, 2019, 8 pages.

\* cited by examiner

LIGHT EMITTING UNIT AND DISPLAY DEVICE

CROSS-REFERENCE TO RELATED APPLICATIONS

This non-provisional application claims priority under 35 U.S.C. § 119(a) on Patent Application No. 106104076 filed in Taiwan, R.O.C. on Feb. 8, 2017, the entire contents of which are hereby incorporated by reference.

BACKGROUND

Technical Field

The present application is related to a light emitting unit and a display device, and more particularly to a vertical semiconductor light emitting unit and a display device.

Related Art

Light emitting diode (LED) or organic light emitting diode (OLED) is applied in a variety of fields as a light emitting unit with high efficiency. There is a type of vertical LED among the variety of LEDs. The vertical LED has two electrodes at its two sides so as to enhance the mobility of the electron/hole. However, the aperture ratio is decreased due to the electrode at the light emission side and the light emission rate is therefore decreased.

SUMMARY

In one embodiment of the present invention, a light emitting unit has a first electrode, a second electrode, and an epitaxial structure disposed between the first electrode and the second electrode. The epitaxial structure has a light emission layer, a first type semiconductor layer disposed between the light emission layer and the first electrode, and a second type semiconductor layer disposed between the light emission layer and the second electrode. The first surface of the second type semiconductor layer is facing the light emission layer, and the second surface of the second type semiconductor layer is opposite to the first surface and has at least one recess. At least part of the second electrode is disposed in the at least one recess.

In one embodiment of the present invention, a display device has a substrate, a first electrode connection layer, a second electrode connection layer, and a plurality of light emitting units. Each of the light emitting units has a first electrode, a second electrode, and an epitaxial structure disposed between the first electrode and the second electrode. The epitaxial structure has a light emission layer, a first type semiconductor layer disposed between the light emission layer and the first electrode, and a second type semiconductor layer disposed between the light emission layer and the second electrode. The first surface of the second type semiconductor layer is facing the light emission layer, and the second surface of the second type semiconductor layer is opposite to the first surface and has at least one recess. At least part of the second electrode is disposed in the at least one recess.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
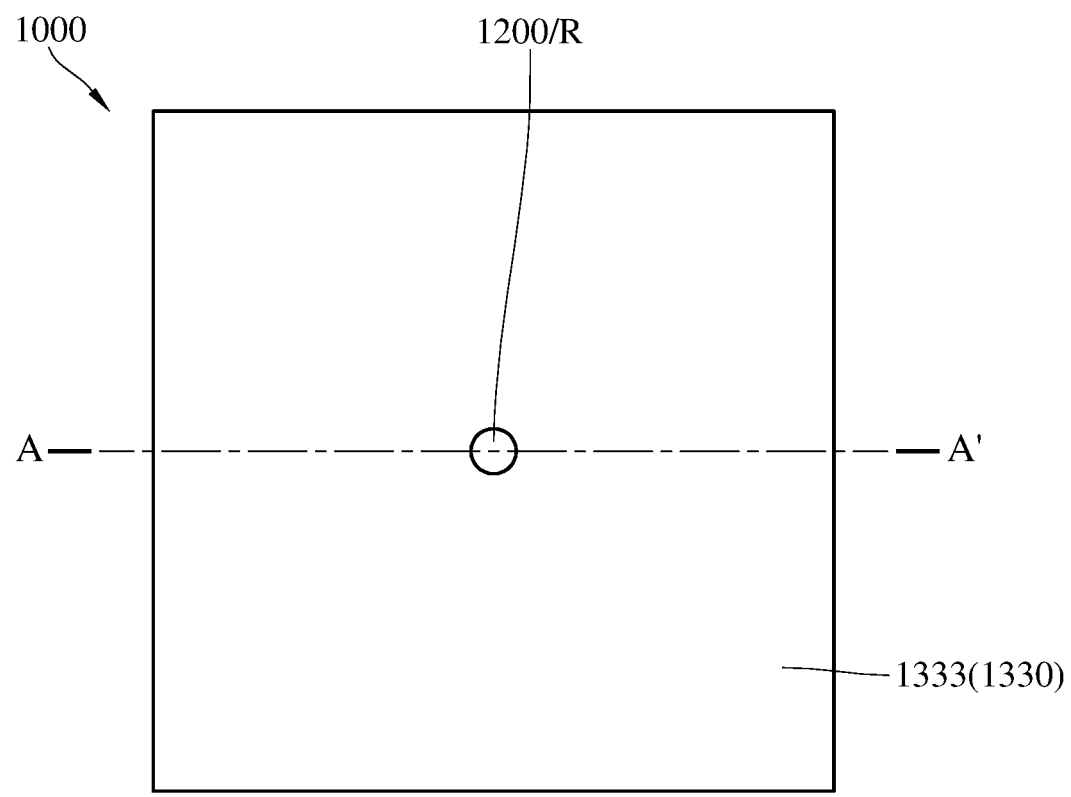
FIG. 1A is a top view of the light emitting unit according to one embodiment of the present invention.
Figure 1B:
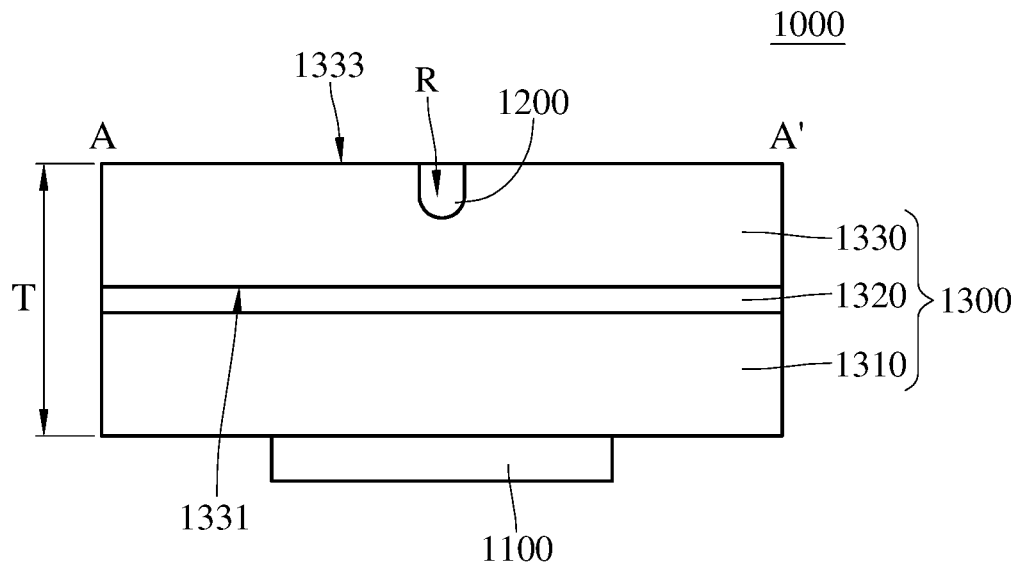
FIG. 1B is a sectional view of the light emitting unit along the section line AA' in FIG. 1A.

Please refer to FIG. 1A and FIG. 1B, wherein FIG. 1A is a top view of the light emitting unit according to one embodiment of the present invention, and FIG. 1B is a sectional view of the light emitting unit along the section line AA' in FIG. 1A. As shown in the figures, the light emitting unit 1000 according to one embodiment of the present invention has a first electrode 1100, a second electrode 1200, and an epitaxial structure 1300.

The epitaxial structure 1300 is disposed between the first electrode 1100 and the second electrode 1200. The epitaxial structure 1300 has a light emission layer 1320, a first type semiconductor layer 1310 disposed between the light emission layer 1320 and the first electrode 1100, and a second type semiconductor layer 1330 disposed between the light emission layer 1320 and the second electrode 1200. A first surface 1331 of the second type semiconductor layer 1330 is facing the light emission layer 1320, and a second surface 1333 of the second type semiconductor layer 1330 is opposite to the first surface 1331 and has at least one recess R. In the embodiment shown in FIG. 1B, the first surface 1331 of the second type semiconductor layer 1330 is directly contacted with the light emission layer 1320. In another embodiment, there may be one or more additional layers between the first surface 1331 and the light emission layer 1320. Hereinafter, one recess R is taken for example. The recess R is formed on the second type semiconductor layer 1330 by etching, and is in a central area of the second surface 1333. At least part of the second electrode 1200 is disposed in the recess R. The materials for forming the epitaxial structure 1300 may be II-VI semiconductors such as ZnSe or III-V nitride semiconductors such as GaN, AlN, InN, InGaN, AlGaN or AlInGaN.

The thickness T of the epitaxial structure 1300 is preferably no larger than 6 micrometers (um). Further, the thickness T of the epitaxial structure 1300 is usually larger than 1 micrometer. The yield rate in the subsequent process may be influenced when the thickness is too thick or too thin. For example but not limitation, the thickness of the second type semiconductor layer 1330 may be larger than the thickness of the first type semiconductor layer 1310, wherein the thickness of the second type semiconductor layer 1330 ranges from 1 um to 5 um, the thickness of the light emission layer ranges from 0.1 um to 1 um, and the thickness of the first type semiconductor layer 1330 ranges from 0.1 um to 0.5 um. The type of doping in the first type semiconductor layer 1310 is different from the type of doping in the second type semiconductor layer 1330. For example, the first type semiconductor layer 1310 is a P-type doped semiconductor layer, while the second type semiconductor layer 1330 is an N-type doped semiconductor layer. The light emission layer 1320 is, for example but not limited to, a multiple quantum well (MQW) structure. The ratio between the depth of the recess R and the thickness the second type semiconductor layer 1330 is larger than zero and no larger than 0.4. There may be defects in the epitaxial structure 1300 while the ratio is larger than 0.4.

Figure 1C:
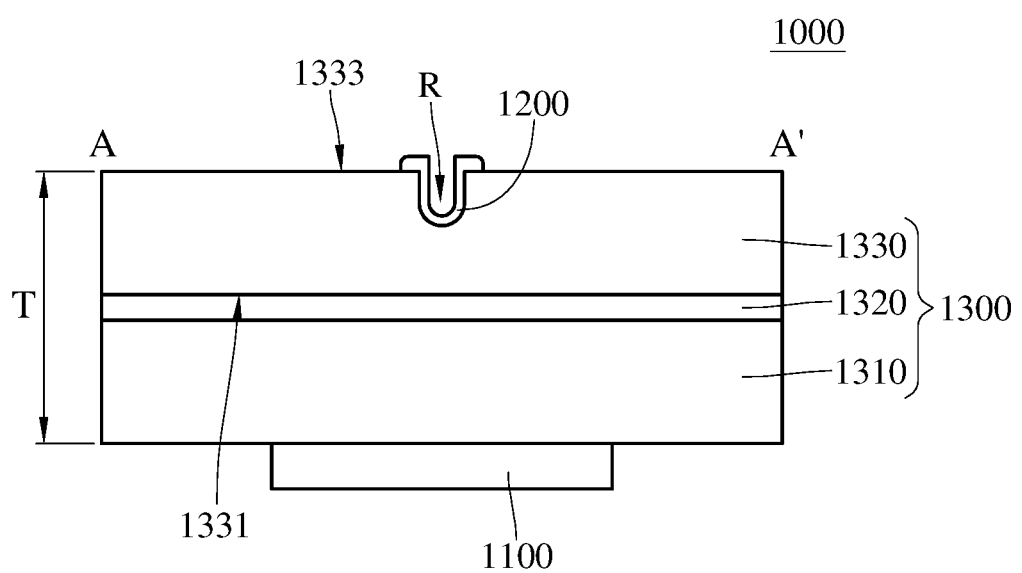
FIG. 1C, which is a sectional view of the light emitting unit in another embodiment of the present invention.
Figure 1D:
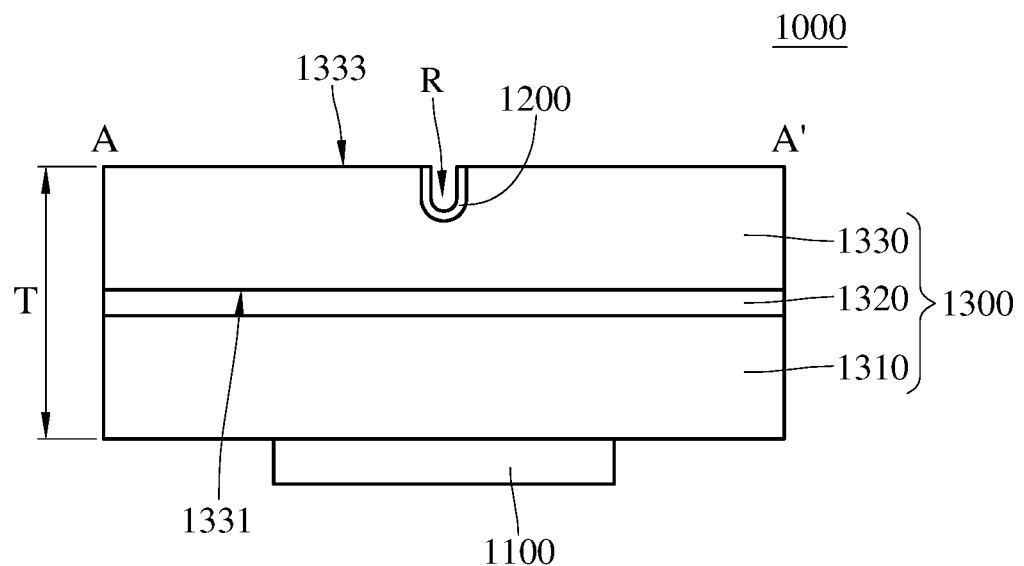
FIG. 1D, which is a sectional view of the light emitting unit in yet another embodiment of the present invention.
Figure 1E:
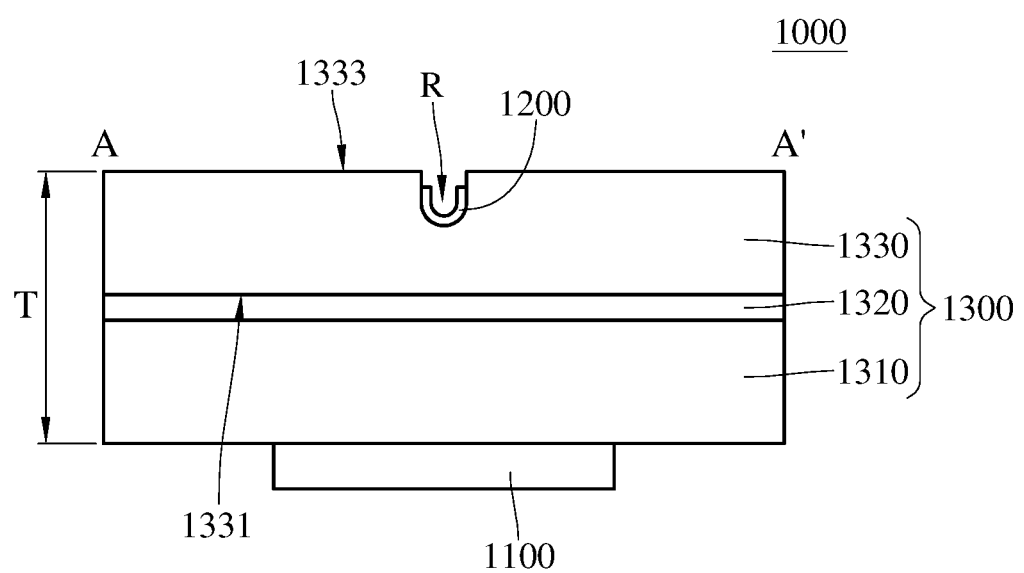
FIG. 1E, which is a sectional view of the light emitting unit in still another embodiment of the present invention.

In one embodiment as shown in FIG. 1B, the second electrode 1200 is disposed within the recess R entirely. In this embodiment, the recess R is fully filled with the second electrode 1200, and the second electrode 1200 is a pillar structure with one surface aligning with the opening of the recess R and co-plane with the second surface 1333. In another embodiment, please refer to FIG. 1C, which is a sectional view of the light emitting unit in another embodiment of the present invention. As shown in FIG. 1C, the second electrode 1200 exceeds the opening of the recess R, which means the second surface 1333 is not co-plane with the surface of the second electrode 1200. In other words, part of the second electrode 1200 is disposed in the recess R while the other part of the second electrode 1200 is not in the recess R so as to increase the contacting area of the electrode. In yet another embodiment, please refer to FIG. 1D, which is a sectional view of the light emitting unit in yet another embodiment of the present invention. As shown in FIG. 1D, the second electrode 1200 is disposed on the bottom and the lateral surface of the recess R entirely without filling the recess R. In other words, the second electrode 1200 in this embodiment is in a U-shape. In still another embodiment, please refer to FIG. 1E, which is a sectional view of the light emitting unit in still another embodiment of the present invention. As shown in FIG. 1E, the whole second electrode 1200 is disposed in the recess R. Explicitly, the second electrode 1200 is disposed on the bottom of the recess R and portion of the lateral surface of the recess R. In other words, a surface of the second electrode 1200 is lower than the opening of the recess R.

Please refer back to FIG. 1A, taking the recess R fully filled with the second electrode 1200 for example, a ratio between the opening area of the recess R and a top view area of the second surface 1333 of the second type semiconductor layer 1330 ranges from 0.01 to 0.5. If the ratio is larger than 0.5, the second electrode 1200 may block part of the emitted light. If the ratio is less than 0.01, the current distribution may be uneven. The ratio preferably ranges from 0.02 to 0.2 so as to keep both of the current distribution and the light emission efficiency. For example, in the first embodiment, the top view of the second type semiconductor layer 1330 is a square with 15 micrometers (um) side length, and the opening of the recess R is a circle with 3 um diameter so as to keep both of the current distribution efficiency and the light emission efficiency. Although the example in the aforementioned embodiment is about the second type semiconductor layer 1330 whose top view is square and with recess R of circle opening, none of the shape of the top view of the second type semiconductor 1330, the opening shape of the recess R, and the cross-sectional view shape of the recess R should be limited. For example, the top view of the second type semiconductor layer 1330 may also be rectangular, circle, or other adequate shape. The opening of the recess R may also be square, rectangular, eclipse, or other adequate shape. The cross-sectional view of the recess R may also be square, rectangular, eclipse, pillar shape, or other adequate shape.

With the arrangement in FIGS. 1B to 1E, the area of the opening of the recess R, which is also the area of the second electrode 1200 from the top view of the second type semiconductor 1330, is only $2.25\pi$ um$^2$, the contact area between the second electrode 1200 and the second type semiconductor layer 1330, which is the total area of both of the bottom and the lateral surface of the recess R, is much more than the area of the opening of the recess R. Hence, the contacting area between the second electrode 1200 and the second type semiconductor layer 1330 is increased and so as the current distribution and/or the light emission efficiency. It should be noted that the maximum width of the light emitting unit 1000 ranges from 1 micrometer (um) to 100 um, and preferably from 3 um to 30 um. That is, the light emitting unit 1000 in the embodiment is a micro light emitting unit (Micro LED). Because the size of the micro LED is so small that it is difficult to arrange the electrode to achieve better current distribution efficiency without blocking the light, the obstacle may be conquered by disposing the second electrode 1200 in the recess R.

Figure 2:
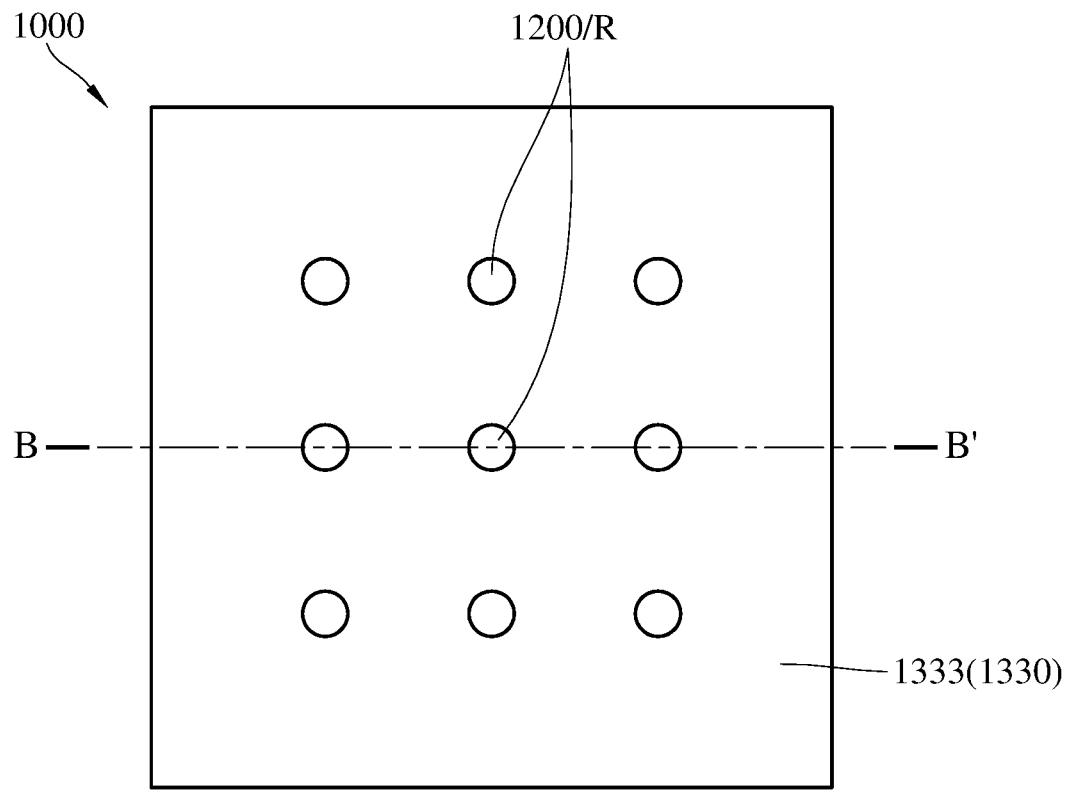
FIG. 2 is a top view of a light emitting unit in another embodiment of the present invention.
Figure 3:
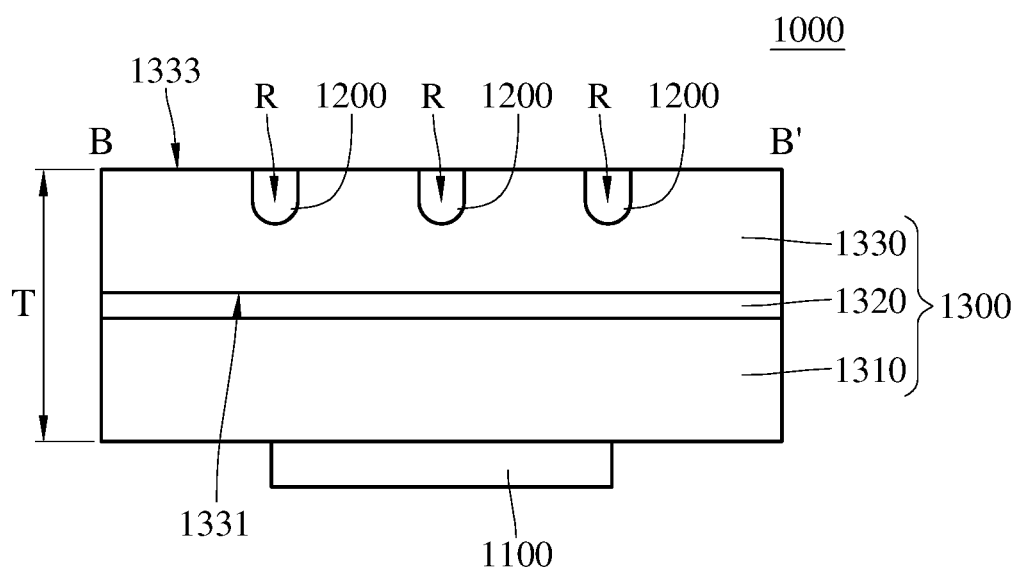
FIG. 3 is a sectional view of the light emitting unit along the section line BB' in FIG. 2.

In another embodiment, please refer to FIG. 2 and FIG. 3, wherein FIG. 2 is a top view of a light emitting unit in another embodiment of the present invention, and FIG. 3 is a sectional view of the light emitting unit along the section line BB' in FIG. 2. As shown in FIG. 2 and FIG. 3, the second surface 1333 of the second type semiconductor layer 1330 of the epitaxial structure 1300 of the light emitting unit 1000 has a plurality of recesses R, and each recess R has the second electrode 1200 therein. Further, the recesses R and the second electrodes 1200 therein are disposed on the second surface 1333 of the second type semiconductor layer 1330 separately, which means there is a certain distance between any two recesses R. In the embodiment, the top view of the second surface 1333 of the second type semiconductor 1330 is a square with a side length of 15 um and the opening of each recess R is a circle with 3 um diameter. There are totally 9 recesses R on the second surface 1333 of the second type semiconductor 1330. In other words, there are totally 9 second electrodes 1200 disposed on the second surface 1333 of the second type semiconductor layer 1330 so as to make the current distribution even. The plurality of recesses R are arranged on the second surface 1333 equidistantly. In other embodiments (not shown), the recesses R may be arranged on the second surface 1333 arbitrarily. For example, the recesses R may be arranged adjacent to the edges of the second surface 1333 so as to prevent the emitted light from being blocked. It should be noted in FIG. 2 that the ratio between the total area of the openings of the recesses and the top view area of the second surface 1333 ranges from 0.01 to 0.5. If the ratio is larger than 0.5, the second electrode 1200 may block part of the emitted light. If the ratio is less than 0.01, the current distribution may be uneven. The ratio preferably ranges from 0.01 to 0.2 so as to keep both of the current distribution and the light emission efficiency.

The first electrode 1100 and the second electrode 1200 are contacted with and electrically connected to the first type semiconductor layer 1310 and the second semiconductor layer 1330, respectively. The first electrode 1100 here is, for example, a P type electrode and the second electrode 1200 is, for example, an N type electrode. In one embodiment, the first electrode 1100 and the second electrode 1200 are made of metal with high work function such as Pt, Ni, Ti, Au, Cr, the alloy of aforementioned metals, or the combination thereof, or made of metallic oxide such as ITO or ZnO, or made of conductive non-metal material such as conductive macromolecule, graphite, grapheme, or black phosphorum. The metal with high work function is metal with work function no less than 4.5 volt.

Figure 4:
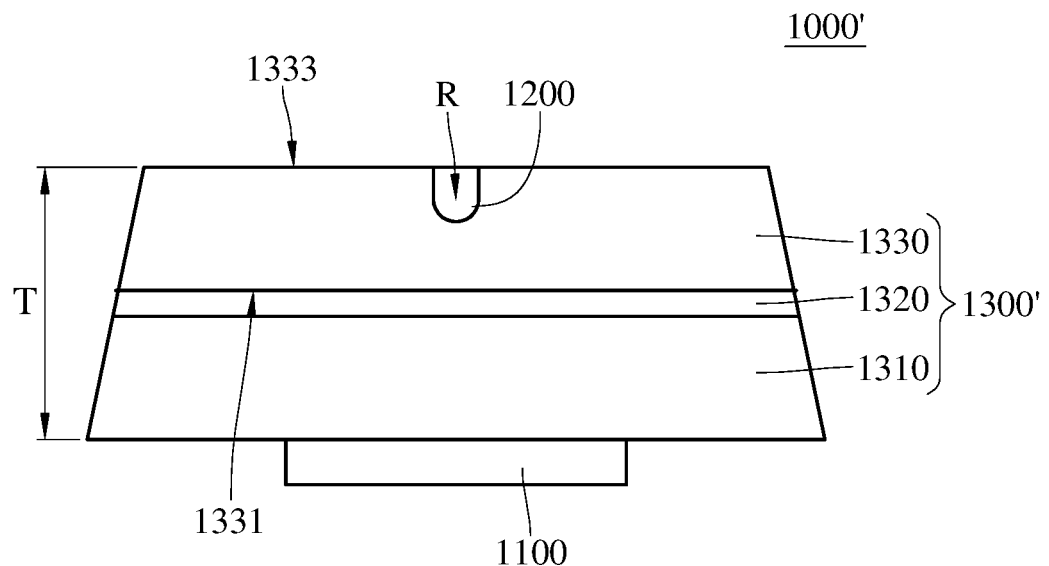
FIG. 4, which is a sectional view of a light emitting unit in one embodiment of the present invention.

In one embodiment, please refer to FIG. 4, which is a sectional view of a light emitting unit in one embodiment of the present invention. As shown in FIG. 4, the epitaxial structure 1300' of the light emitting unit 1000' is different from the epitaxial structure 1300 of the light emitting unit 1000 in FIG. 1B. Explicitly, the size of the first type semiconductor layer 1310 is larger than the size of the second type semiconductor layer 1330 in the epitaxial structure 1300' in FIG. 4. That is, the side view of the epitaxial structure 1300' is in trapezoid shape. The difference between the size of the first type semiconductor layer 1310 and the second type semiconductor layer 1330 here ranges from 0 um to 5 um so as to be applied in the following applications flexibly.

Figure 5:
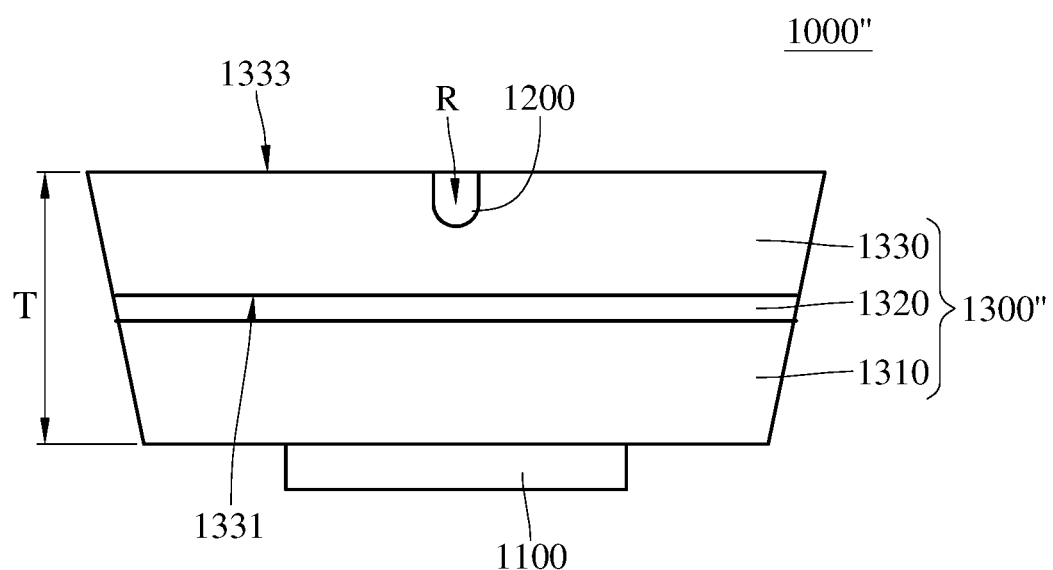
FIG. 5, which is a sectional view of a light emitting unit in another embodiment of the present invention.

In another embodiment, please refer to FIG. 5, which is a sectional view of a light emitting unit in another embodiment of the present invention. As shown in FIG. 5, the epitaxial structure 1300" of the light emitting unit 1000' is different from the epitaxial structure 1300 of the light emitting unit 1000 in FIG. 1B or the epitaxial structure 1300' of the light emitting unit 1000' in FIG. 4. Explicitly, the size of the first type semiconductor layer 1310 is smaller than the size of the second type semiconductor layer 1330 in the epitaxial structure 1300" in FIG. 5. That is, the side view of the epitaxial structure 1300" is in inverted-trapezoid shape. The difference between the size of the first type semiconductor layer 1310 and the second type semiconductor layer 1330 here ranges from 0 um to 5 um so as to be applied in the following applications flexibly.

Figure 6:
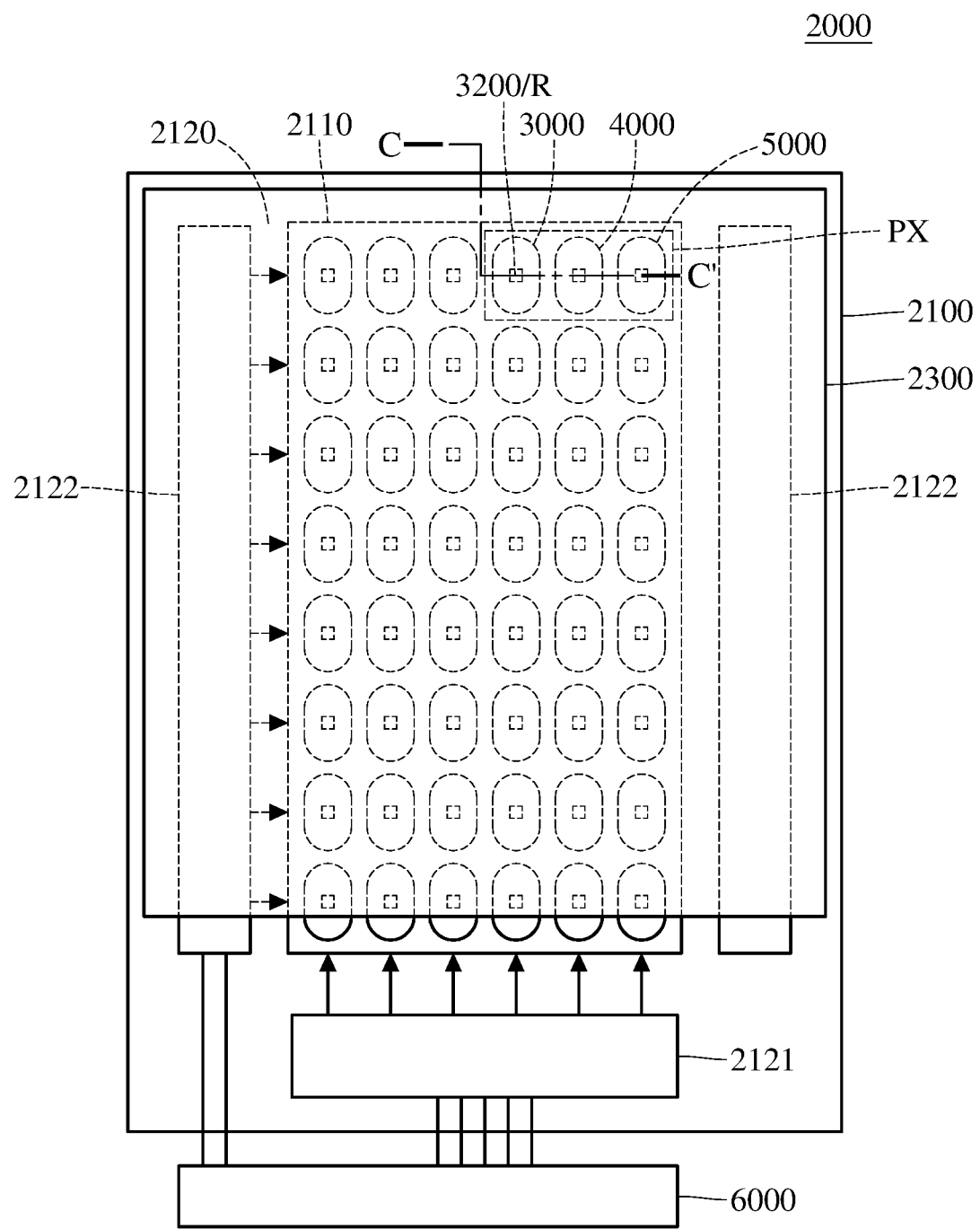
FIG. 6 is a top view of a display device in one embodiment of the present invention.
Figure 7:
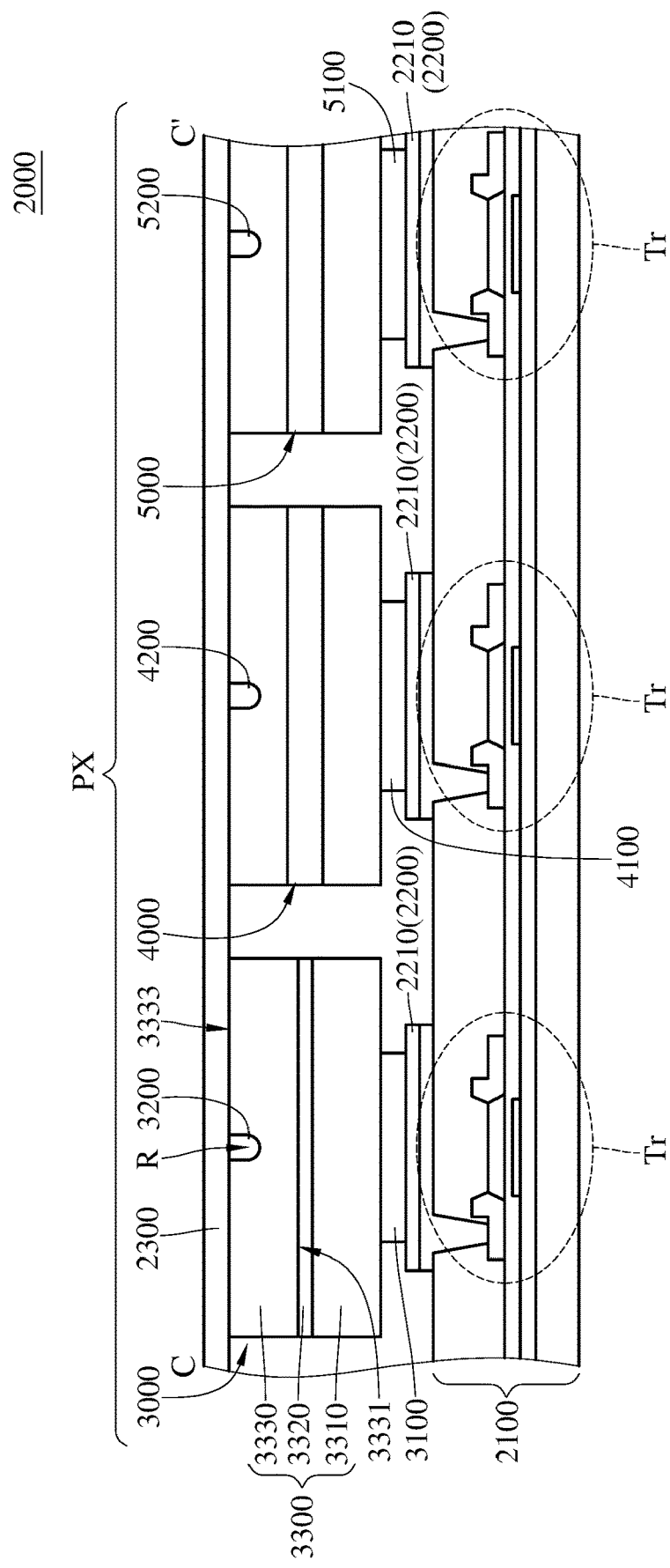
FIG. 7 is a sectional view of the pixel structure in FIG. 6.

Another embodiment of the present invention discloses a display device. Please refer to FIG. 6 and FIG. 7, wherein FIG. 6 is a top view of a display device in one embodiment of the present invention, and FIG. 7 is a sectional view of the pixel structure in FIG. 6. As shown in FIG. 6 and FIG. 7, the display device 2000 has a substrate 2100, a first electrode connection layer 2200 disposed on the substrate 2100, a plurality of light emitting units 3000, 4000, and 5000, and a second electrode connection layer 2300. The substrate 2100 is, for example, a complementary metal-oxide-semiconductor (CMOS) substrate, a liquid crystal on silicon (LCOS) substrate, a thin film transistor (TFT) substrate or other substrates having function circuits. In the following example, the substrate 2100 is a TFT substrate.

Specifically, the substrate 2100 has an active area 2110 and a non-active area 2120. A plurality of pixel structures PX are disposed on the active area 2110 of the substrate 2100, and each of the pixel structures PX has at least one light emitting unit. In the embodiment, one pixel structure PX has three light emitting units 3000, 4000, and 5000. The light emitting unit 3000 is, for example, corresponding to a blue sub-pixel; the light emitting unit 4000 is, for example, corresponding to a green sub-pixel; and the light emitting unit 5000 is, for example, corresponding to a red sub-pixel. It should be noted that these pixel structures PX may be arranged with a density ranging from 40 pixels per inch (PPI) to 400 PPI to provide good resolution. There are the data driving circuit 2121 and the scanning circuit 2122 disposed in the non-active area 2120 of the substrate 2100. The data driving circuit 2121 is electrically connected to each of the light emitting units 3000, 4000, and 5000 so as to send data signal to each of the light emitting units 3000, 4000, and 5000. The scanning circuit 2122 is electrically connected to each of the light emitting units 3000, 4000, and 5000 so as to send scanning signal to each of the light emitting units 3000, 4000, and 5000. All of the data driving circuit 2121, the scanning circuit 2122, and the light emitting units 3000, 4000, and 5000 are electrically connected to a control circuit 6000 such as a printed circuit board, which drives and controls the light emission of the light emitting units 3000, 4000, and 5000.

Taking the light emitting unit 3000 for example, the light emitting unit 3000 has a first electrode 3100, a second electrode 3200 and an epitaxial structure 3300. The epitaxial structure 3300 is disposed between the first electrode 3100 and the second electrode 3200. The epitaxial structure 3300 has a light emission layer 3320, a first type semiconductor layer 3310 disposed between the light emission layer 3320 and the first electrode 3100, and a second type semiconductor layer 3330 disposed between the light emission layer 3320 and the second electrode 3200. The first surface 3331 of the second type semiconductor 3330 is facing the light emission layer 3320. In this embodiment, the first surface 3331 is directly contacted with the light emission layer 3320. In another embodiment, there may be one or more additional layers between the light emission layer 3320 and the first surface 3331. The second surface 3333 of the second type semiconductor layer 3330 is opposite to the first surface 3331 and has at least one recess R. At least part of the second electrode 3200 is disposed in the at least one recess R of the second type semiconductor layer 3330. The material of the epitaxial structure 3300 may be II-VI semiconductors such as ZnSe or III-V Nitride semiconductors such as GaN, AlN, InN, InGaN, AlGaN, or AlInGaN. In one embodiment, there may be an insulating layer filling in the space between the light emitting units 3000, 4000, and 5000 so as to prevent the light emitting units from moisture and oxygen and to improve the reliability of the light emitting units. In another embodiment, there may be reflecting layer disposed between the light emitting units 3000, 4000, and 5000 so as to efficiently reflect the emitted light from the lateral side of the light emitting units 3000, 4000, and 5000 so as to improve the light emission efficiency.

The thickness of the epitaxial structure 3300 is preferably no more than 6 um. It should be noted that the epitaxial structures of the light emitting units 3000, 4000, and 5000 may have different thickness. For example, the light emitting unit 3000 is corresponding to a blue sub-pixel so the thickness of the epitaxial structure therein may be thicker than the other two epitaxial structures so as to improve the light emitting efficiency thereof. The first type semiconductor layer 3310 and the second type semiconductor layer 3330 have different doping type. For example, the first type semiconductor layer 3310 is a P type doped semiconductor layer, and the second type semiconductor layer 3330 is an N type doped semiconductor layer. The light emission layer 3320 is, for example, a multiple quantum well (MQW) structure. The ratio between the depth of the recess R and the thickness the second type semiconductor layer 3330 is larger than zero and no larger than 0.4. There may be defects in the epitaxial structure 1300 while the ratio is larger than 0.4. Taking the recess R fully filled with the second electrode 1200 for example, a ratio between the opening area of the recess R and a top view area of the second surface 1333 of the second type semiconductor layer 1330 ranges from 0.01 to 0.5. If the ratio is larger than 0.5, the second electrode 1200 may block part of the emitted light. If the ratio is less than 0.01, the current distribution may be uneven. The ratio preferably ranges from 0.02 to 0.2 so as to keep both of the current distribution and the light emission efficiency.

In one embodiment, the epitaxial structure of each of the light emitting units may be identical to each other or different from each other. For example, each epitaxial structure of each of the light emitting units may be pillar-shape as shown in FIG. 7. Similarly, the epitaxial structures may be all in trapezoid shape or in inverted trapezoid shape. In another embodiment, the epitaxial structures in the pixel structure PX are not all identical. For example, the epitaxial structure of the light emitting unit 3000 and the epitaxial structure of the light emitting unit 5000 may be in inverted trapezoid shape while the epitaxial structure of the light emitting unit 4000 is in trapezoid shape.

The first electrode connection layer 2200 here is a plurality of first electrode connection structure 2210 isolated from on another. The light emitting unit 3000, the light emitting unit 4000, and the light emitting unit 5000 are disposed on and electrically connected to the corresponding first electrode connection structure 2210 via the first electrode 3100, the first electrode 4100, and the first electrode 5100, respectively. The substrate 2100 further comprises a plurality of function circuits Tr, the first electrode connection structure 2210 is disposed on and electrically connected to the corresponding function circuit Tr. The function circuit Tr may be, for example, switching transistor, driving transistor, capacitor, and the combination thereof. Each of the function circuits Tr is electrically connected to the data driving circuit 2121, the scanning circuit 2123 and the light emitting unit 3000, 4000, and 5000. In one embodiment, the first electrode connection layer 2200 may be consisting of material capable of reflecting visible light, and the material of the second electrode connection layer 2300 is selected, for example but not limited to, from the group consisting of Au, Cu, Sn, In, the alloy of the aforementioned materials, and the combination thereof.

The second electrode connection layer 2300 is disposed on one of the second electrode 3200 of the light emitting unit 3000, the second electrode 4200 of the light emitting unit 4000, and the second electrode 5200 of the light emitting unit 5000, and electrically connected to the light emitting unit 300, 4000, or 5000 via the second electrode 3200, 4200, or 5200. That is, the second electrode connection layer 2300 is a common electrode of the light emitting unit 3000, 4000, and 5000. The second electrode connection layer 2300 here is connected to the wire (not shown) and the outer connecting node (not shown) in the non-active area 2120 of the substrate 2100 so as to be electrically connected to the control circuit 6000. The control circuit 6000 drives and controls the data driving circuit 2121, the scanning circuit 2123, and the function circuit Tr by sending signals so as to driving the light emission of each of the light emitting units 3000, 4000, and 5000 by address. In the embodiment, the thickness of the second electrode connection layer 2300 ranges from 2000 angstroms to 10000 angstroms. If the thickness is less than 2000 angstroms, the conductivity of the common electrode would be limited. If the thickness is more than 10000 angstroms, the light emission efficiency would be limited. In one embodiment, the second electrode connection layer 2300 is made of transparent materials or semi-transparent materials. The second electrode connection layer 2300 here is, for example but not limited to, Indium Tin Oxide (ITO) so as to provide good light emission rate. It should be noted that, in certain embodiment (not shown), the recess R is not fully filled with the second electrode 3200, and the second electrode connection layer 2300 may be disposed in the recess R and connected to the second electrode 3200. In other words, the contacting area between the second electrode connection layer 2300 and the second electrode 3200 may be therefore increased so as to provide better current distribution efficiency.

As above, the present invention discloses a light emitting unit and a display device having the light emitting unit. In the epitaxial structure of the light emitting unit, there is at least one recess formed on/in one of the semiconductor layers and an electrode filled in the at least one recess so that the contacting area between the electrode and the semiconductor layer is increased and the light emission efficiency and/or the current distribution is therefore enhanced.

What is claimed is:

1. A light emitting unit, comprising:
   a first electrode;
   a second electrode; and
   an epitaxial structure disposed between the first electrode and the second electrode and comprising:
   a light emission layer;
   a first type semiconductor layer disposed between the light emission layer and the first electrode; and
   a second type semiconductor layer disposed between the light emission layer and the second electrode, wherein the second type semiconductor layer has a first surface facing the light emission layer and a second surface opposite to the first surface, wherein the second surface has a plurality of recesses;
   wherein each of the recesses has a bottom surface and a lateral surface, the second electrode is disposed into the recess, the second electrode covers the lateral surface and an entire of the bottom surface without filling the recess entirely, a region of the second surface of the second type semiconductor layer which is between any two of the recesses is exposed by the second electrode.

2. The light emitting unit according to claim 1, wherein a ratio between a depth of the at least one recess and a thickness of the second type semiconductor layer is larger than 0 and less than or equal to 0.4.

3. The light emitting unit according to claim 1, wherein a ratio between an opening area of the at least one recess and a top view area of the second surface is no less than 0.01 and no larger than 0.5.

4. The light emitting unit according to claim 1, wherein the plurality of recesses are disposed on the second surface separately.

5. The light emitting unit according to claim 1, wherein the second electrode is disposed in the at least one recess entirely.

6. The light emitting unit according to claim 5, wherein a surface of the second electrode aligns an opening of the at least one recess.

7. The light emitting unit according to claim 5, wherein a surface of the second electrode is within the at least one recess.

8. The light emitting unit according to claim 1, wherein a thickness of the epitaxial structure is no larger than 6 micrometers.

9. The light emitting unit according to claim 1, wherein a maximum width of the light emitting unit ranges from 1 micrometer to 100 micrometers.

10. A display device, comprising:
a substrate;
a first electrode connection layer disposed on the substrate;
a plurality of light emitting units disposed on the first electrode connection layer, each of the light emitting units comprising:
a first electrode disposed on the first electrode connection layer;
a second electrode; and
an epitaxial structure disposed between the first electrode and the second electrode, wherein the epitaxial structure comprises:
a light emission layer;
a first type semiconductor layer disposed between the light emission layer and the first electrode; and
a second type semiconductor layer disposed between the light emission layer and the second electrode, wherein the second type semiconductor layer has a first surface facing the light emission layer and a second surface opposite to the first surface, wherein the second surface has a plurality of recesses, wherein each of the recesses has a bottom surface and a lateral surface, the second electrode is disposed into the recess, the second electrode covers the lateral surface and an entire of the bottom surface without filling the recess entirely, a region of the second surface of the second type semiconductor layer which is between any two of the recesses is exposed by the second electrode; and
a second electrode connection layer disposed on the second electrode of each of the light emitting units and contacting with the region of the second surface of the second semiconductor which is exposed by the second electrode.

11. The display device according to claim 10, wherein, in each of the light emitting units, a ratio between a depth of the at least one recess and a thickness of the second type semiconductor layer is larger than 0 and less than or equal to 0.4.

12. The display device according to claim 10, wherein, in each of the light emitting units, a ratio between an opening area of the at least one recess and a top view area of the second surface is no less than 0.01 and no larger than 0.5.

13. The display device according to claim 10, wherein the recesses are disposed on the second surface separately.

14. The display device according to claim 10, wherein the second electrode of each of the light emitting unit is disposed in the at least one recess entirely.

15. The display device according to claim 14, wherein a surface of the second electrode of one of the light emitting units aligns an opening of the at least one recess of said light emitting unit.

16. The display device according to claim 14, wherein a surface of the second electrode of one of the light emitting units is within the at least one recess of said light emitting unit.

17. The display device according to claim 10, wherein a thickness of the epitaxial structure of each of the light emitting units is no larger than 6 micrometers.

18. The display device according to claim 10, wherein a maximum width of each of the light emitting units ranges from 1 micrometer to 100 micrometers.

19. The display device according to claim 10, wherein the second electrode connection layer is further disposed into the recess of the second type semiconductor layer of each of the light emitting units and connected to the second electrode of each of the light emitting units.

20. The display device according to claim 10, wherein the plurality of light emitting units forms a plurality of pixel structures, and each of the pixel structures comprises at least of the light emitting unit, and the pixel structures are arranged with a density ranging from 40 pixels per inch (PPI) to 400 PPI.

21. A display device, comprising:
a substrate;
a first electrode connection layer disposed on the substrate;
a plurality of light emitting units disposed on the first electrode connection layer, each of the light emitting units comprising:
a first electrode disposed on the first electrode connection layer;
a second electrode; and
an epitaxial structure disposed between the first electrode and the second electrode, wherein the epitaxial structure comprises:
a light emission layer;
a first type semiconductor layer disposed between the light emission layer and the first electrode; and
a second type semiconductor layer disposed between the light emission layer and the second electrode, wherein the second type semiconductor layer has a first surface facing the light emission layer and a second surface opposite to the first surface, wherein the second surface has a plurality of recesses, wherein each of the recesses has a bottom surface and a lateral surface, the second electrode is disposed into the recess, the second electrode covers the lateral surface and an entire of the bottom surface without filling the recess entirely, a region of the second surface of the second type semiconductor layer which is between any two of the recesses is exposed by the second electrode; and
a second electrode connection layer is disposed into the recess of the second type semiconductor of each of the light emitting units and connected to the second electrode of each of the light emitting units.

22. The light emitting unit according to claim 1, wherein a contact area between the second electrode and the second type semiconductor layer is more than an area of an opening of the recess.

23. The display device according to claim 10, wherein the second electrode connection layer entirely contacts with a part of the second electrode which is exposed on the second surface of the second semiconductor and at least contacts with a part of the region of the second surface of the second semiconductor.

24. The display device according to claim 21, wherein the second electrode connection layer entirely contacts with a part of the second electrode which is exposed on the second surface of the second semiconductor and at least contacts with a part of the region of the second surface of the second semiconductor.

25. The light emitting unit according to claim 1, wherein the second electrode covers an entire of the lateral surface and the entire of the bottom surface without filling the recess entirely.

26. The display device according to claim 10 or 21, wherein the second electrode covers an entire of the lateral surface and the entire of the bottom surface without filling the recess entirely.

* * * * *